United States Patent
Brown

(10) Patent No.: US 10,828,680 B2
(45) Date of Patent: Nov. 10, 2020

(54) SYSTEM AND METHOD FOR ENHANCED REMOVAL OF METAL HARDMASK USING ULTRA VIOLET TREATMENT

(71) Applicant: Tokyo Electron Limited, Tokyo (JP)

(72) Inventor: Ian J. Brown, Austin, TX (US)

(73) Assignee: Tokyo Electron Limited, Tokyo (JP)

(*) Notice: Subject to any disclaimer, the term of this patent is extended or adjusted under 35 U.S.C. 154(b) by 991 days.

(21) Appl. No.: 14/537,652

(22) Filed: Nov. 10, 2014

(65) Prior Publication Data
US 2015/0128990 A1 May 14, 2015

Related U.S. Application Data

(60) Provisional application No. 61/902,514, filed on Nov. 11, 2013.

(51) Int. Cl.
| | | |
|---|---|---|
| *B08B 3/08* | (2006.01) | |
| *B08B 3/10* | (2006.01) | |
| *B08B 7/00* | (2006.01) | |
| *C11D 11/00* | (2006.01) | |
| *H01L 21/67* | (2006.01) | |

(52) U.S. Cl.
CPC .............. *B08B 7/0057* (2013.01); *B08B 3/08* (2013.01); *C11D 11/0047* (2013.01); *H01L 21/6715* (2013.01); *H01L 21/67051* (2013.01); *H01L 21/67115* (2013.01); *B08B 3/10* (2013.01)

(58) Field of Classification Search
CPC ........... B08B 3/08; B08B 3/10; B08B 7/0057; H01L 21/67115; H01L 21/67051; H01L 21/6715; H01L 21/02054; C11D 11/0047
See application file for complete search history.

(56) References Cited

U.S. PATENT DOCUMENTS

| | | | |
|---|---|---|---|
| 6,800,142 B1 * | 10/2004 | Tipton | ...................... B08B 3/08 |
| | | | 134/1 |
| 2006/0183248 A1 | 8/2006 | Small | |
| 2007/0054492 A1 | 3/2007 | Elliott et al. | |

(Continued)

FOREIGN PATENT DOCUMENTS

| | | |
|---|---|---|
| KR | 10-2007-0026687 | 3/2007 |
| KR | 10-2012-0101990 | 9/2012 |

(Continued)

OTHER PUBLICATIONS

International Search Report and Written Opinion dated Feb. 23, 2015 in PCT/US2014/064852.

(Continued)

*Primary Examiner* — Alexander Markoff
(74) *Attorney, Agent, or Firm* — Oblon, McClelland, Maier & Neustadt, L.L.P.

(57) ABSTRACT

Systems and methods for cleaning a substrate include a combined treatment of hydrogen peroxide and ultraviolet (UV) irradiation. Specific embodiments include the direct irradiation with 185/254 nm UV of a spinning substrate immersed under a liquid film of dilute hydrogen peroxide solution. Such a cleaning treatment can result in about a 100% improvement of TiN strip rate compared to processing with the same hydrogen peroxide solution without UV exposure. Such method can also be executed at room temperature and still provide improved cleaning efficiency.

20 Claims, 2 Drawing Sheets

(56) References Cited

U.S. PATENT DOCUMENTS

| | | |
|---|---|---|
| 2007/0227556 A1 | 10/2007 | Bergman |
| 2009/0215658 A1 | 8/2009 | Minsek et al. |
| 2011/0132394 A1* | 6/2011 | Rastegar .................. B08B 3/10 134/1 |
| 2013/0200040 A1* | 8/2013 | Fitzsimmons .... H01L 21/02063 216/17 |

FOREIGN PATENT DOCUMENTS

| | | |
|---|---|---|
| SG | 190068 A1 | 6/2013 |
| TW | 201104740 A1 | 2/2011 |
| TW | 201232196 A1 | 8/2012 |

OTHER PUBLICATIONS

Combined Taiwanese Office Action and Search Report dated Apr. 11, 2016 in Patent Application No. 103138947 (with English language translation).

KR Office Action dated Oct. 26, 2017 in corresponding application No. 10-2016-7015423 filed Jun. 10, 2016 (with English translation).

Office Action dated May 18, 2018, in Korean Patent Application No. 10-2016-7015423 (with English-language translation).

* cited by examiner

SYSTEM AND METHOD FOR ENHANCED REMOVAL OF METAL HARDMASK USING ULTRA VIOLET TREATMENT

CROSS REFERENCE TO RELATED APPLICATIONS

The present application claims the benefit of U.S. Provisional Patent Application No. 61/902,514, filed on Nov. 11, 2013, entitled "System and Method for Enhanced Removal of Metal Hardmask Using Ultra Violet Treatment," which is incorporated herein by reference in its entirety.

BACKGROUND OF THE INVENTION

The present application relates generally to semiconductor processing and relates particularly to a substrate cleaning processes.

Fabrication of integrated circuits and semiconductor devices can involve many different types of processing techniques. Such techniques generally involve patterning a substrate and using the pattern to make various sacrificial and/or permanent structures. For example, photolithography can be used to create patterned layers using a thin layer of radiation-sensitive material, such as photoresist. This radiation-sensitive layer is transformed into a patterned mask that can be used to etch or transfer a pattern into an underlying layer on a substrate. Thus the patterned layer of photoresist can act as a mask for directional (anisotropic) etching of one or more underlying layers. To overcome challenges in photolithography image transfer, a patterned photoresist (functioning as a mask), can be used to create a mask in an underlying material with significantly different etch selectivity, this material is commonly referred to as a hardmask. Creating a hardmask can be beneficial because a given target underlying layer to be etched can respond to an etch chemistry that might simultaneously etch photoresist material, which would render a given photoresist relief pattern essentially ineffective to be used as a mask for some materials to be etched. Fabrication of integrated circuits and semiconductor devices can be a cyclical process of depositing materials, modifying materials, patterning materials, and removing materials. It is common to have a need to remove one type of material (such as a hardmask) without removing a second type of material, such as a patterned underlying layer. Various cleaning processes can be implemented to selectively remove or clean materials off of a given substrate. Such cleaning processes can include both wet cleaning techniques (such as reactive liquid chemicals) and dry cleaning techniques (such as plasma-based cleaning) using particular chemistries and/or physical mechanisms to clean materials off of a substrate.

SUMMARY

Certain substrate cleaning applications involve removing a hardmask from a substrate without damaging an underlying low-k dielectric film. Thus, a hardmask that has been used as an etch mask to etch a low-k dielectric film typically needs to be selectively removed to continue with fabrication processes. Such low dielectric films can be applicable to dielectric films that a have k-value less than about 2.6 and/or have a silicon, carbon, oxygen and hydrogen chemical bond structure. Such dielectric films can be porous or more susceptible to damage as compared to other film materials. Hardmasks can include titanium nitride (TiN) as well as other hard masks or similar materials such as amorphous carbon, TaN, and SiC. Techniques herein are applicable for removal of essentially any conventional, sacrificial hardmask including non-oxide based hardmasks.

One embodiment includes a method for cleaning a substrate. This method includes receiving a substrate in a cleaning system. The cleaning system includes a wet clean system, a processing chamber, and a fluid delivery sub system. The substrate includes a hardmask layer deposited on an underlying layer. This cleaning method includes spinning the substrate on a substrate holder in the processing chamber and depositing a diluted hydrogen peroxide solution on a top surface of the substrate. The hydrogen peroxide solution on the substrate is irradiated with ultraviolet (UV) electromagnetic radiation while the substrate is spinning. The UV electromagnetic radiation has a wavelength between approximately 185-500 nanometers. The hardmask is dissolved by irradiated hydrogen peroxide and then being removed from the substrate by action of hydrogen peroxide flow and by action of spinning the substrate.

Techniques herein have been demonstrated to increase the strip rate of a TiN hardmask film by 100% as compared to conventional techniques of stripping TiN hardmasks. Conventionally, hardmasks are removed from low-k films using a wet etching process in which a solution containing hydrogen peroxide ($H2O2$) is dispensed on a spinning wafer at an elevated temperature. The $H2O2$ reacts with the hardmask to dissolve the hardmask, leaving underlying films and structures on the substrate. The drawback of such a cleaning process is that this conventional process treats a single wafer at a time, and cleaning a given TiN hardmask from a wafer (such as a 300 mm diameter) can take about 6 minutes. Such a relatively long treatment time reduces throughput and efficiency. Thus, the improvements herein are advantageous in improving productivity of the post etch cleaning tool, by reducing a treatment temperature of TiN strip chemistry, reducing an amount of chemistry used, reducing a cleaning time by half or more, and extending lifetime of a strip tool and corresponding chemistry.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily

DETAILED DESCRIPTION

Techniques herein include systems and methods for cleaning a substrate. Methods include a combined treatment of hydrogen peroxide and ultraviolet (UV) irradiation. Specific embodiments include the direct irradiation with 185/254 nm light from a low pressure mercury UV lamp of a spinning substrate immersed under a liquid film of dilute hydrogen peroxide solution. In one example result, irradiating a hydrogen peroxide solution of 20% hydrogen peroxide by weight with about 185/254 nm wavelength UV light having an intensity of 12 mW/cm2 using 254 nm wavelength UV light results in about a 100% improvement of TiN strip rate as compared to processing with the same hydrogen peroxide solution without UV irradiation.

Techniques herein can increase TiN removal at room temperature by 25%-100% or more. An increased removal rate also occurs at higher temperatures and also with hydrogen peroxide mixed with other cleaning components. Conventional chemical suppliers sell one-step back-end-of-line (BEOL) cleaning chemistry that must be mixed with hydrogen peroxide to enable post etch polymer removal and titanium nitride hardmask removal. Such conventional BEOL cleaning chemistry can be used with techniques herein. There are several alternative embodiments of the enhanced removal techniques here. For example, a two-step process can also be used. In this alternative process, a polymer removal step is executed first, followed by a second step applying a dilute hydrogen peroxide-containing solution to a given substrate.

Figure 1:
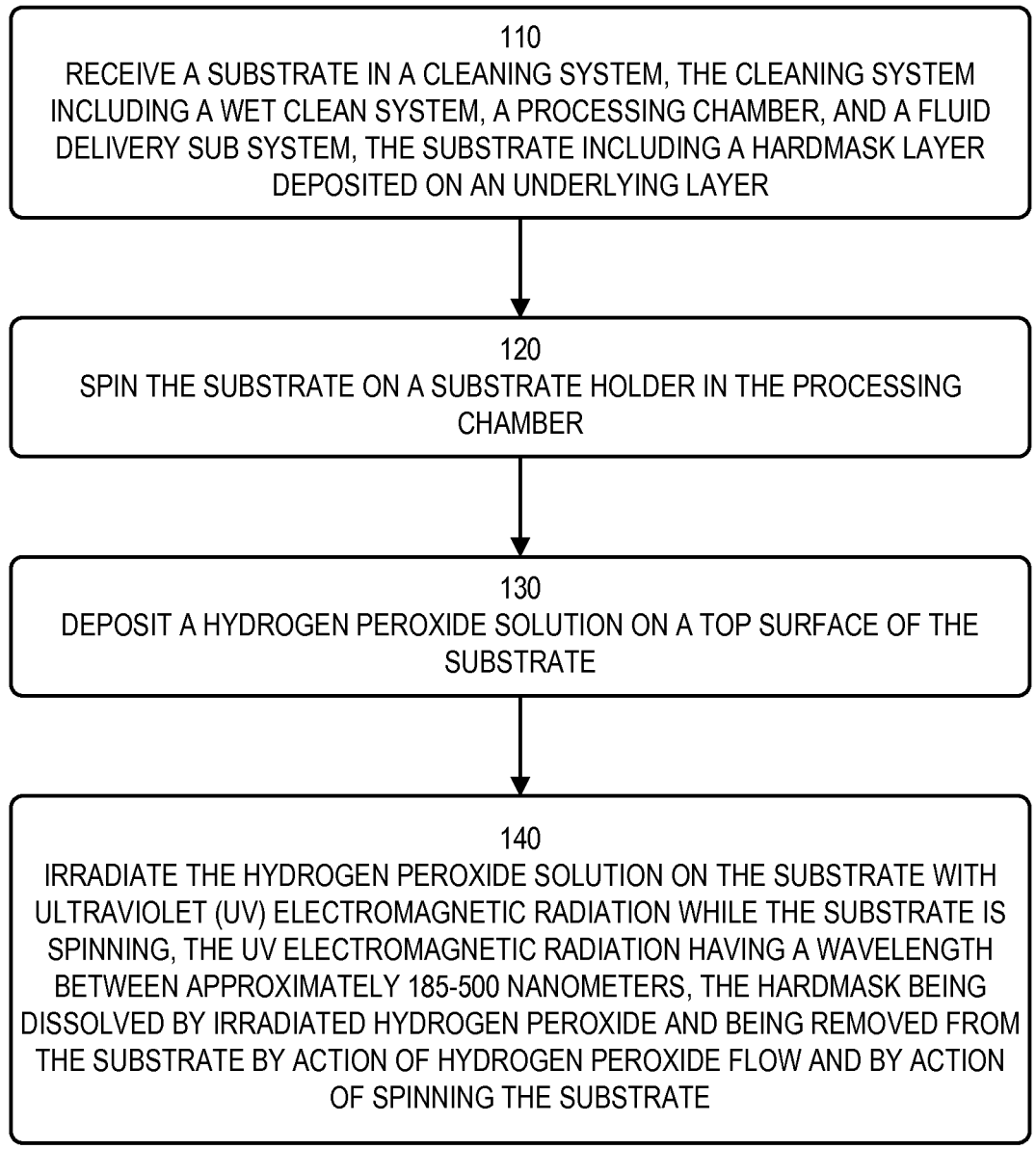
FIG. 1 is a flow chart of an example process according to embodiments herein.

Referring now to FIG. 1, a flow chart of an example process flow for cleaning a substrate is shown. In step 110, a substrate 205 is received in a cleaning system 200, such as that shown in FIG. 2. The substrate 205 can include semiconductors, flat panels, wafers, etc. The cleaning system 200 includes a wet clean system 210, a processing chamber 220, and a fluid delivery subsystem. The wet clean system 210 can include a nozzle 211 for dispensing liquid chemistry onto a surface of substrate 205. The nozzle 211 can be connected to a fluid delivery subsystem via feed pipe 212. A nozzle arm 213 can be mounted on a vertical support member 215 that can be horizontally moveable on a guide rail 214, or rotationally movable. The substrate 205 can be received in the cleaning system 200 via delivery member 209, which can place substrate 205 on substrate holder 202. Substrate holder 202 can include drive motor 203 configure to rotate substrate holder 202 at a given rotational velocity. The cleaning system can include UV light source 250 configured to irradiate UV light towards substrate 205. A system controller (not shown) can be coupled to the substrate cleaning system and configured to control rotation speed of the substrate, UV irradiation, and treatment liquid delivery.

Figure 3:
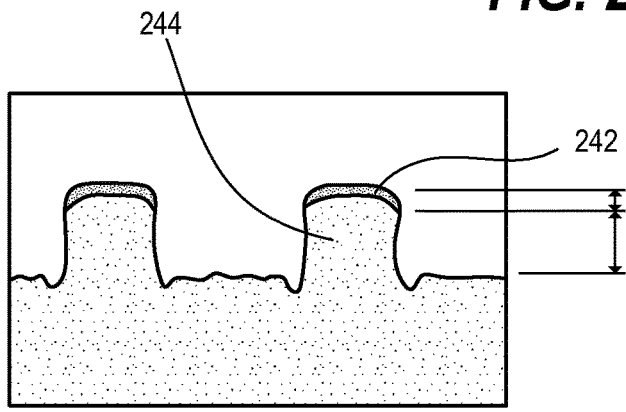
FIG. 3 is a cross-sectional illustration of a substrate segment having a hardmask on patterned features according to embodiments herein.
Figure 4:
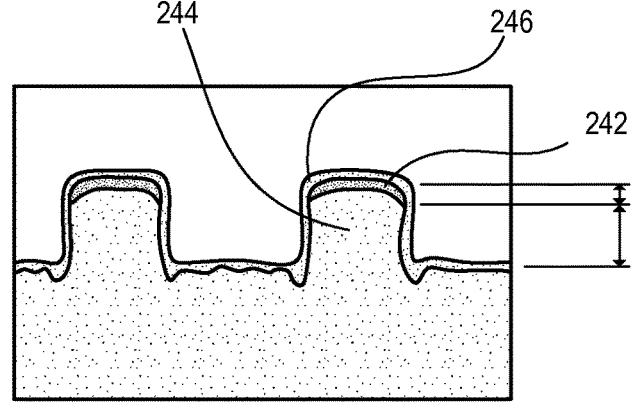
FIG. 4 is a cross-sectional illustration of a substrate segment having a hardmask and polymer coating on patterned features according to embodiments herein.

The substrate can include a hardmask 242 deposited on an underlying layer 244 as illustrated in FIG. 3. FIG. 3 is a cross-sectional illustration of an example substrate segment. Note that the hardmask 242 can be used to transfer a mask pattern into the underlying layer 244. Example substrates can have ultra low-k features with a TiN hardmask—or other hardmask 242—on top of the low-k features. It is this metal hardmask that a particular cleaning process can be specified to remove. An objective or specification of the cleaning process can be to leave the underlying material undamaged, such as low-k dielectric material. The hardmask layer 242 can be a layer or film that has a greater density as compared to the low-k material. This hardmask layer 242 can be used to improve etching processes into softer low-k dielectrics. In example embodiments, a hardmask layer composition can be comprised of a material $Si_xM_{(1-x)}N_yO_zB_w$, wherein M represents either individually or a combination of Ti, W, Ta, Ge, C and x is less than 1 including zero. A given hardmask film can be in a crystalline or amorphous state. The hardmask can include a metal hardmask layer using one or more of titanium nitride (TiN), tantalum nitride (TaN), silicon carbide (SiC), and amorphous carbon.

In step 120, the substrate 205 is spun on the substrate holder 202 in the processing chamber 220. In step 130, a hydrogen peroxide solution 225 is deposited on a top surface of the substrate 205. Solutions compatible with techniques herein can have a hydrogen peroxide portion less than 35% by weight (safety issues can arise with higher percentage weights). Conventional solutions can operate around 5% by weight. With techniques herein, a higher weight percentage of hydrogen peroxide can improve etch rate. In some embodiments, a hydrogen peroxide weight percentage can be 15% to 25%. The hydrogen peroxide solution 225 can be dispensed with a steady flow or by pulsing the solution. Although the solution can be dispensed by pulsing, the pulsing dispenses sufficient solution such that the substrate is continuously covered with the hydrogen peroxide solution. In other words, the pulsing is sufficient to ensure that the substrate is continually wetted during the pulsed dispense. Dry spots should be avoided because periodic drying of the substrate can cause a rise of particles, defects and pattern collapse. Another reason to avoid dry spots is to avoid a risk of TiN hardmask being oxidized by direct UV radiation to insoluble TiO2.

Dispensing the hydrogen peroxide solution 225 can include mixing a corrosion prevention mixture with the hydrogen peroxide solution. Such a solution can prevent corrosion of copper and keep metal species in solution. A solution can also contain one or more chelating agents (to extend bath life) targeted toward a particular metal film being removed. The solution can also include a pH buffer for either acidic or basic solutions. Other alternative embodiments can include a solvent to assist with polymer residue removal, and also a metal chelating agent.

Figure 2:
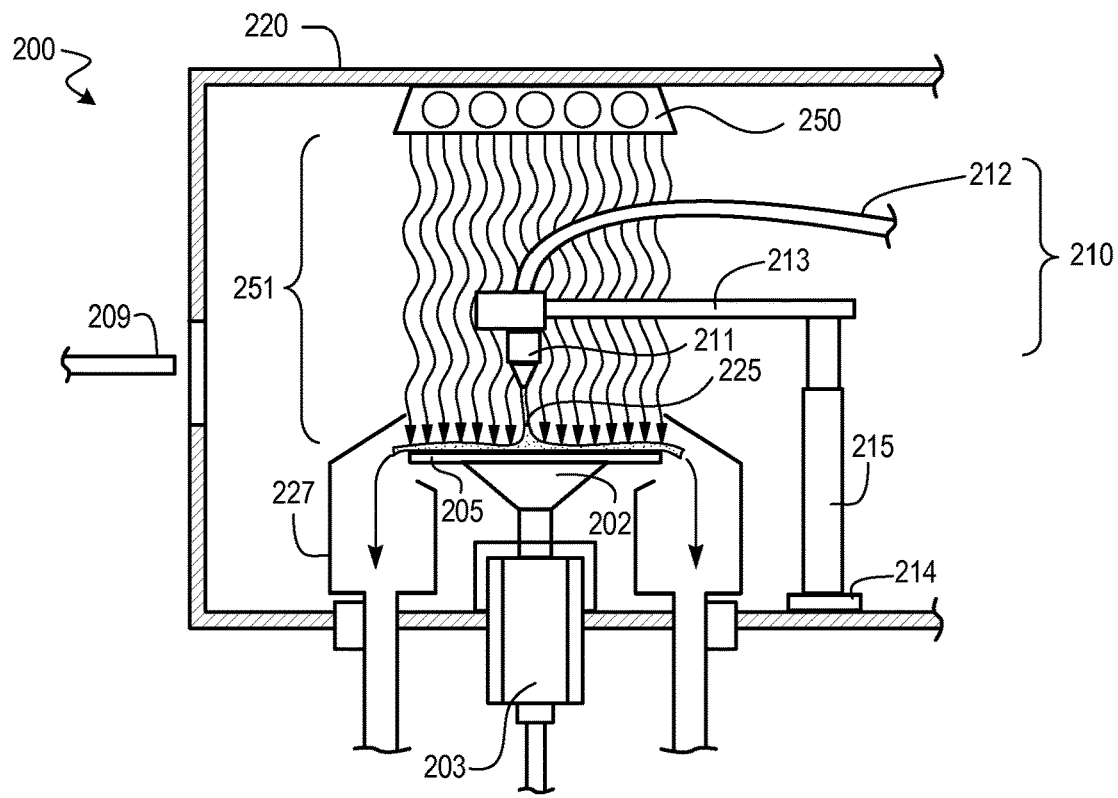
FIG. 2 is a cross-sectional schematic view of an example cleaning system according to embodiments herein.

In step 140, the hydrogen peroxide solution 225 on the substrate 205 is irradiated with ultraviolet (UV) electromagnetic radiation with the substrate 205 is spinning. Item 251 of FIG. 2 depicts such solution irradiation by the UV electromagnetic radiation. The UV electromagnetic radiation can have a wavelength between approximately 185-500 nanometers. The hardmask is dissolved by irradiated hydrogen peroxide and is removed from the substrate by action of hydrogen peroxide flow and also by action of spinning the substrate. Spinning and irradiating the substrate can continue until the hardmask layer is removed. Waste solution having dissolved hardmask particles can then be collected using such as by using a collection system 227, and then can be subsequently recycled, disposed of, or otherwise processed.

In some embodiments, irradiating the hydrogen peroxide solution can include irradiating the UV electromagnetic radiation having a wavelength between approximately 185-254 nanometers, which can be accomplished using various types of UV sources and/or filters. For example, a broadband UV source (160 nm-1100 nm wavelength) can have specific filters to block illumination below and/or above a specific wavelength, or to permit only specific wavelengths to pass through. By way of a non-limiting example, treatments can include irradiating with UV electromagnetic radiation having an intensity greater that approximately 4 milliwatts per centimeter squared or greater than 800 mW/cm$^2$ with the UV source positioned at about 5 cm from a substrate surface. A dosage amount can depend on a particular application or cleaning process. In other embodiments, the UV intensity per unit area is sufficient to increase a hardmask strip rate by more than approximately 25% as compared to a strip rate of the hardmask without irradiation.

Other embodiments can include a segmented or gradient UV exposure. For example, irradiating the hydrogen peroxide solution includes irradiating a central portion of the substrate at a first intensity, and irradiating an edge portion of the substrate at a second intensity, wherein the first intensity is greater than the second intensity. In such an embodiment, an inner radial portion of a substrate can receive more UV light than a peripheral radial portion of a substrate. Hydrogen peroxide solution flow can be thicker towards a center point of a substrate, and so increased UV exposure at a center portion can be beneficial to assist with solution activation where there is a relatively thicker solution on the substrate.

Techniques herein can enable relatively lower temperature processing conditions. In one embodiment, a process temperature is maintained in the processing chamber that is less than approximately 50 degrees Celsius. Other embodiments can operate with effective results at less than 30 degrees Celsius.

Some embodiments can involve cleaning both a hardmask layer 242 and a polymer layer 246, which can be a film material or residue resulting from an etch transfer process. In such schemes, prior to depositing the hydrogen peroxide solution, a polymer cleaning solution can be deposited that removes polymer layer 246 from the substrate.

When executing a conventional cleaning process (conventional spin-on chemistry), after about 10 minutes of cleaning (spinning on a substrate holder while solution is being dispensed on the surface) 50% of the TiN hardmask is removed—this is using a 20% H2O2 solution at 25 degrees Celsius. With techniques herein, however, dispensing a 20% H2O2 solution, a wafer spin speed can be controlled so that a film solution of less than 2000 microns results on the surface of the substrate. With this relatively thin film covering the substrate, the hydrogen peroxide solution is irradiated with the UV electromagnetic radiation having a wavelength between approximately 185-500 nanometers. The temperature of the cleaning process and/or solution can be maintained at about 25 degrees Celsius. This treatment process results in TiN hardmask removal of about 97%.

In other embodiments, hydrogen peroxide solutions from 1% weight to 35% weight can be used with temperatures ranging from 0° C. to 80° C. In some embodiments, performance can be optimized by creating a thinnest continuous liquid film on the wafer. In some embodiments the liquid film is less than 2000 microns, while in other embodiments the thickness is less than 200 microns or even 20 microns. Thus, the solution is being continuously dispensed and irradiated during a treatment period. It is important to ensure continuous wetting of the substrate to prevent oxygen incorporation into the TiN film and formation of insoluble titanium oxide (TiO2). Oxidation of TiN in hydrogen peroxide solutions converts TiN to soluble [Ti(O2)(OH)n] species. Note that many substrates have a hydrophobic surface, and thus spinning is useful to maintain a continuous film. Spinning can also be used on hydrophilic substrates.

These techniques significantly enhance etching performance of the hydrogen peroxide without changes to the liquid chemistry itself. The etch rate of the TiN can be controlled by turning on or off the UV illumination or by varying UV intensity. Intensity can also be varied radially relative to the substrate. For example, a given film solution can be thicker toward a center of the substrate as compared to an edge of the substrate (where rotational speeds are higher). A UV intensity can then be configured to be greater at the center of the substrate to help UV rays penetrate through the film thickness to reach hydrogen peroxide molecules on the surface of the substrate. When UV radiation strikes hydrogen peroxide, hydrogen peroxide can be broken down into highly reactive forms of oxygen. With the highly reactive oxygen species in contact with the metal hardmask, removal of the metal hardmask is accelerated. One challenge, however, is that the highly reactive oxygen species exist for an extremely short time—on the order of milliseconds. Thus, if the solution film is relatively thick, then (depending on the intensity of UV radiation) only hydrogen peroxide molecules within an upper portion of the film would be broken down. The highly reactive species are then too far from the surface of the substrate to accelerate etching. With a thinner film solution and/or higher intensity of UV radiation, highly reactive oxygen species can be created at a surface of the substrate and accelerate etching.

Embodiments can include any of a number of UV sources. These can be lamps, diode arrays, and so forth. By enabling productive etch rates of hardmasks and at lower temperatures, the lifetime of the etching chemistry can be enhanced and the cost of each cleaning process can be reduced. In a conventional cleaning tool, the TiN etching/stripping chemistry is typically recycled within the tool for many passes over the wafer.

Dispense rate can be important and embodiments can use a Low Film Thickness (LFT) dispense procedure. Thin liquid films are obtained by using a low flow rate and the flow of chemistry is periodically cycled on and off. By way of a non-limiting example, at 1000 revolutions per minute, a cycle of 3 seconds off and 1 second on can be used. For a 300 mm or 450 mm wafer a number of dispense positions from center to edge can be used to ensure an average low film thickness across the wafer—preferably less than or equal to 20 micron film thickness. To obtain film thicknesses less than 200 or 20 microns, cycling the solution flow on and off can greatly assist. With a single nozzle center dispense nozzle, cyclically shutting off solution dispense flow can help thickness of the film in the center flatten to less than 20 microns.

Accordingly, techniques herein can improve efficiency in both time and amount of materials used. For single-pass systems there is a savings in time and materials. For recirculating systems there is at least a savings in time.

Existing hardware systems for wet cleaning can be used to implement the methods herein, with the addition of a UV light source. Thus, a system can include a substrate holder having a rotation mechanism, an enclosure to catch fluid that spins off of the substrate, and a nozzle or nozzle array positioned above the substrate. The nozzle can be constructed as an atomizer. Also positioned above is a UV radiation source or reflector/conduit that directs radiation—from a remote UV source—to the substrate surface.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for cleaning a substrate, the method comprising:
   receiving a substrate in a cleaning system, the cleaning system including a wet clean system, a processing chamber, and a fluid delivery sub system, the substrate including a hardmask layer deposited on an underlying layer;
   spinning the substrate on a substrate holder in the processing chamber;
   depositing a hydrogen peroxide solution on a top surface of the substrate;
   irradiating the hydrogen peroxide solution on the substrate with ultraviolet (UV) electromagnetic radiation to create reactive oxygen species while the substrate is spinning, the UV electromagnetic radiation having a wavelength between approximately 185-400 nanometers, the hardmask being dissolved by irradiated hydrogen peroxide and being removed from the substrate by action of hydrogen peroxide flow and by action of spinning the substrate, wherein said irradiating comprises providing said UV at a radially non-uniform intensity to compensate for radially non-uniform thickness of the hydrogen peroxide solution on a top surface of the substrate.

2. The method of claim 1, wherein irradiating the hydrogen peroxide solution includes irradiating with UV electromagnetic radiation having a wavelength between approximately 185-254 nanometers.

3. The method of claim 1, wherein irradiating the hydrogen peroxide solution includes providing a UV electromagnetic radiation intensity greater than approximately 4 milliwatts per centimeter squared.

4. The method of claim 3, wherein irradiating the hydrogen peroxide solution includes providing a UV electromagnetic radiation intensity greater than approximately 800 milliwatts per centimeter squared.

5. The method of claim 1, wherein irradiating the hydrogen peroxide solution includes irradiating the UV electromagnetic radiation with an intensity per unit area sufficient to increase a hardmask strip rate by more than approximately 25% as compared to a strip rate of the hardmask without irradiation.

6. The method of claim 1, wherein irradiating the hydrogen peroxide solution includes irradiating a central portion of the substrate at a first intensity and irradiating an edge portion of the substrate at a second intensity, wherein the first intensity is greater than the second intensity.

7. The method of claim 1, further comprising, maintain a process temperature within the processing chamber that is less than approximately 50 degrees Celsius.

8. The method of claim 7, wherein maintaining the process temperature within the processing chamber includes maintaining a temperature that is less than 30 degrees Celsius.

9. The method of claim 1, further comprising, prior to depositing the hydrogen peroxide solution, depositing a polymer cleaning solution that removes a polymer layer from the substrate.

10. The method of claim 1, wherein spinning the substrate includes spinning the substrate at a rotational velocity sufficient to cause the deposited hydrogen peroxide solution to have a film thickness of less than approximately 2000 microns.

11. The method of claim 10, wherein spinning the substrate includes spinning the substrate at a rotational velocity sufficient to cause the deposited hydrogen peroxide solution to have a film thickness of less than approximately 200 microns.

12. The method of claim 11, wherein spinning the substrate includes spinning the substrate at a rotational velocity sufficient to cause the deposited hydrogen peroxide solution to have a film thickness of less than approximately 20 microns.

13. The method of claim 1, wherein the hydrogen peroxide solution has less than approximately 35% hydrogen peroxide by weight.

14. The method of claim 13, wherein the hydrogen peroxide has between approximately 15% to 25% hydrogen peroxide by weight.

15. The method of claim 1, wherein depositing the hydrogen peroxide solution includes, mixing a corrosion-prevention mixture with the hydrogen peroxide solution.

16. The method of claim 15, wherein depositing the corrosion prevention mixture includes a mixture including a first agent that prevents corrosion of copper, a second agent that maintains metal species dissolved, a third agent that dissolves polymers, a chelating agent, and a pH buffer.

17. The method of claim 1, wherein depositing the hydrogen peroxide solution includes dispensing liquid in pulses with sufficient hydrogen peroxide solution being dispensed such that the substrate is continuously covered with the hydrogen peroxide solution.

18. The method of claim 1, wherein the hardmask layer is selected from a material having a density greater than a density of the underlying layer.

19. The method of claim 18, wherein the hardmask layer comprises a material selected from the group consisting of Ti, W, Ta, Ge, and C.

20. The method of claim 18, wherein the hardmask layer is a metal hardmask layer selected from the group consisting of titanium nitride (TiN), tantalum nitride (TaN), silicon carbide (SiC), and amorphous carbon.

\* \* \* \* \*